United States Patent
Sheffield et al.

(10) Patent No.: US 11,283,905 B2
(45) Date of Patent: Mar. 22, 2022

(54) RECONFIGURABLE AVIONICS MOUNTING

(71) Applicant: THE BOEING COMPANY, Chicago, IL (US)

(72) Inventors: Gregory L. Sheffield, O'Fallon, MO (US); Fernando Dones, Thornton, PA (US)

(73) Assignee: THE BOEING COMPANY, Chicago, IL (US)

( * ) Notice: Subject to any disclaimer, the term of this patent is extended or adjusted under 35 U.S.C. 154(b) by 993 days.

(21) Appl. No.: 15/971,547

(22) Filed: May 4, 2018

(65) Prior Publication Data

US 2019/0342429 A1     Nov. 7, 2019

(51) Int. Cl.

| | |
|---|---|
| H04L 29/06 | (2006.01) |
| H01R 27/00 | (2006.01) |
| H05K 7/14 | (2006.01) |
| H05K 5/00 | (2006.01) |
| H01R 13/03 | (2006.01) |
| H04B 7/185 | (2006.01) |
| H01R 13/74 | (2006.01) |
| H04L 69/08 | (2022.01) |

(52) U.S. Cl.
CPC ............. *H04L 69/08* (2013.01); *H01R 13/03* (2013.01); *H01R 27/00* (2013.01); *H05K 5/0021* (2013.01); *H05K 7/14* (2013.01); *H05K 7/1412* (2013.01); *H01R 13/74* (2013.01); *H04B 7/18506* (2013.01)

(58) Field of Classification Search
CPC ........................................................ H04L 69/08
See application file for complete search history.

(56) References Cited

U.S. PATENT DOCUMENTS

| | | | |
|---|---|---|---|
| 6,397,128 B1* | 5/2002 | Todd ................... | B64D 45/00 340/945 |
| 7,473,931 B1* | 1/2009 | Beseth ................. | B64D 43/00 257/59 |
| 9,511,728 B2 | 12/2016 | Shander et al. | |
| 9,561,760 B2 | 2/2017 | Shander et al. | |

(Continued)

OTHER PUBLICATIONS

ARINC 404B-2, Connectors, Rack and Panel, Rectangular Rear Release Crimp Contacts, Jun. 30, 2015, pp. 1-103.

(Continued)

*Primary Examiner* — Hsinchun Liao
(74) *Attorney, Agent, or Firm* — Moore IP Law

(57) ABSTRACT

An avionics mounting unit includes a housing with a first mounting interface to couple the housing to a structure of an aircraft and a second mounting interface to couple an avionics device to the housing. The second mounting interface includes slots oriented orthogonal to each other and extending to sides of the housing such that the avionics device can be installed via the slots from any of four sides of the housing. The avionics mounting unit also includes communication circuitry, power supply circuitry, one or more avionics device interface ports, and one or more aircraft interface ports. The avionics device interface port(s) are configured to provide power to the avionics device and configured to enable data communications with the avionics device. The aircraft interface port(s) are configured to receive power from the aircraft and to enable data communications between other aircraft systems and the avionics device.

20 Claims, 8 Drawing Sheets

(56) References Cited

U.S. PATENT DOCUMENTS

| | | |
|---|---|---|
| 9,561,761 B2 | 2/2017 | Walstrom et al. |
| 2005/0047065 A1* | 3/2005 | Cooper ................ H05K 7/1412 |
| | | 361/679.32 |
| 2015/0102663 A1 | 4/2015 | Brouwer et al. |
| 2015/0103457 A1 | 4/2015 | Shander et al. |
| 2017/0180212 A1* | 6/2017 | Fischer .................. H04W 4/80 |

OTHER PUBLICATIONS

ARINC Specification 404A, Air Transport Equipment Cases and Racking, Mar. 15, 1974, pp. 1-209.
HOST—Hardware Open Systems Technologies, Standard Tier 1, Version 2.1, Jul. 6, 2017, pp. 1-36.
HOST—Hardware Open Systems Technologies, Standard Tier2 OpenVPX, Version 3.0, Jun. 26, 2018, pp. 1-80.
MTA Open Standards, Open Markets, Approved ANSI Standard, ANSI/VITA 74.01-2017, Compliant System Small Form Factor Module Base Standard, Dec. 4, 2017, pp. 1-92.

* cited by examiner

RECONFIGURABLE AVIONICS MOUNTING

FIELD OF THE DISCLOSURE

The present disclosure is generally related to reconfigurable avionics mounting systems, methods, and devices.

BACKGROUND

As technology has advanced, aerospace systems have become more complex. While technological advances in aerospace systems provide significant benefits, such as improved safety, cost savings, and passenger convenience, the rapidly changing nature of such advances leads to significant challenges regarding aerospace system integration. For example, today's high-tech aircraft (including commercial, private, and military aircraft) include a large number of disparate devices with different interfaces and supporting different protocols. When new technology is introduced, it can be a significant challenge to ensure compatibility of components that support the new technology with pre-existing systems, interfaces, and protocols. Generally, such system integration is handled on a case-by-case or part-by-part basis. Thus, if a new avionics device is to be added, the new avionics device is tested to verify that it is compatible with each and every other avionics device that it affects or is affected by, which is time consuming and expensive.

SUMMARY

In a particular implementation, an avionics mounting unit includes a housing and communication circuitry and power supply circuitry within the housing. The housing includes a first mounting interface and a second mounting interface. The first mounting interface is configured to facilitate coupling the housing to a structure of an aircraft, and the second mounting interface is configured to facilitate coupling an avionics device to the housing. The second mounting interface includes slots extending to sides of the housing such that the avionics device can be installed via the slots from any of four sides of the housing. The slots including first slots oriented orthogonal to second slots. The avionics mounting unit also includes one or more avionics device interface ports positioned on the housing and coupled to the communication circuitry and to the power supply circuitry. The one or more avionics device interface ports are collectively configured to provide power to the avionics device from the power supply circuitry and are configured to enable data communications between the avionics device and the communication circuitry. The avionics mounting unit further includes one or more aircraft interface ports coupled to the communication circuitry and to the power supply circuitry. The one or more aircraft interface ports are collectively configured to receive power from a power source of the aircraft and are configured to enable data communications between other aircraft systems and the avionics device via the communication circuitry.

In some implementations, an aircraft includes an aircraft structure, a power source, and an avionics mounting unit. The avionics mounting unit has a first mounting interface to be mounted to the aircraft structure and has a second mounting interface. The second mounting interface includes slots extending to sides of the housing such that an avionics device can be installed via the slots from any of four sides of the housing. The slots include first slots oriented orthogonal to second slots. The avionics mounting unit also includes communication circuitry and power supply circuitry within the housing. The avionics mounting unit further includes one or more avionics device interface ports positioned on the housing and coupled to the communication circuitry and to the power supply circuitry. The avionics mounting unit also includes one or more aircraft interface ports coupled to the communication circuitry to enable data communications between the communication circuitry and other aircraft devices. The one or more aircraft interface ports also couple the power source to the power supply circuitry. The aircraft also includes an avionics device mounted to the housing via the slots of the second mounting interface and coupled to communication circuitry and to the power supply circuitry via the one or more avionics device interface ports. The avionics device is configured to communicate with at least a second avionics device of the aircraft via the one or more aircraft interface ports and the one or more avionics device interface ports.

In another particular implementation, a method includes retaining an avionics mounting unit relative to a structure of an aircraft via a first mounting interface of a housing of the avionics mounting unit. The method also includes retaining an avionics device relative to the housing via a coupling between slots of a second mounting interface of the housing and the avionics device. The second mounting interface includes first slots oriented orthogonal to second slots. The slots extend to sides of the housing such that the avionics device can be installed via the slots from any of four sides of the housing. The method also includes receiving, at one or more aircraft interface ports of the avionics mounting unit, a first voltage from a power source of the aircraft and outputting, from one or more avionics device interface ports of the avionics mounting unit, a second voltage to the avionics device, where the second voltage is derived from the first voltage. The one or more avionics device interface ports are positioned on the housing. The method further includes enabling data communications between another aircraft system and the avionics device via the one or more avionics device interface ports of the avionics mounting unit and the one or more aircraft interface ports of the housing.

DETAILED DESCRIPTION

Figure 1:
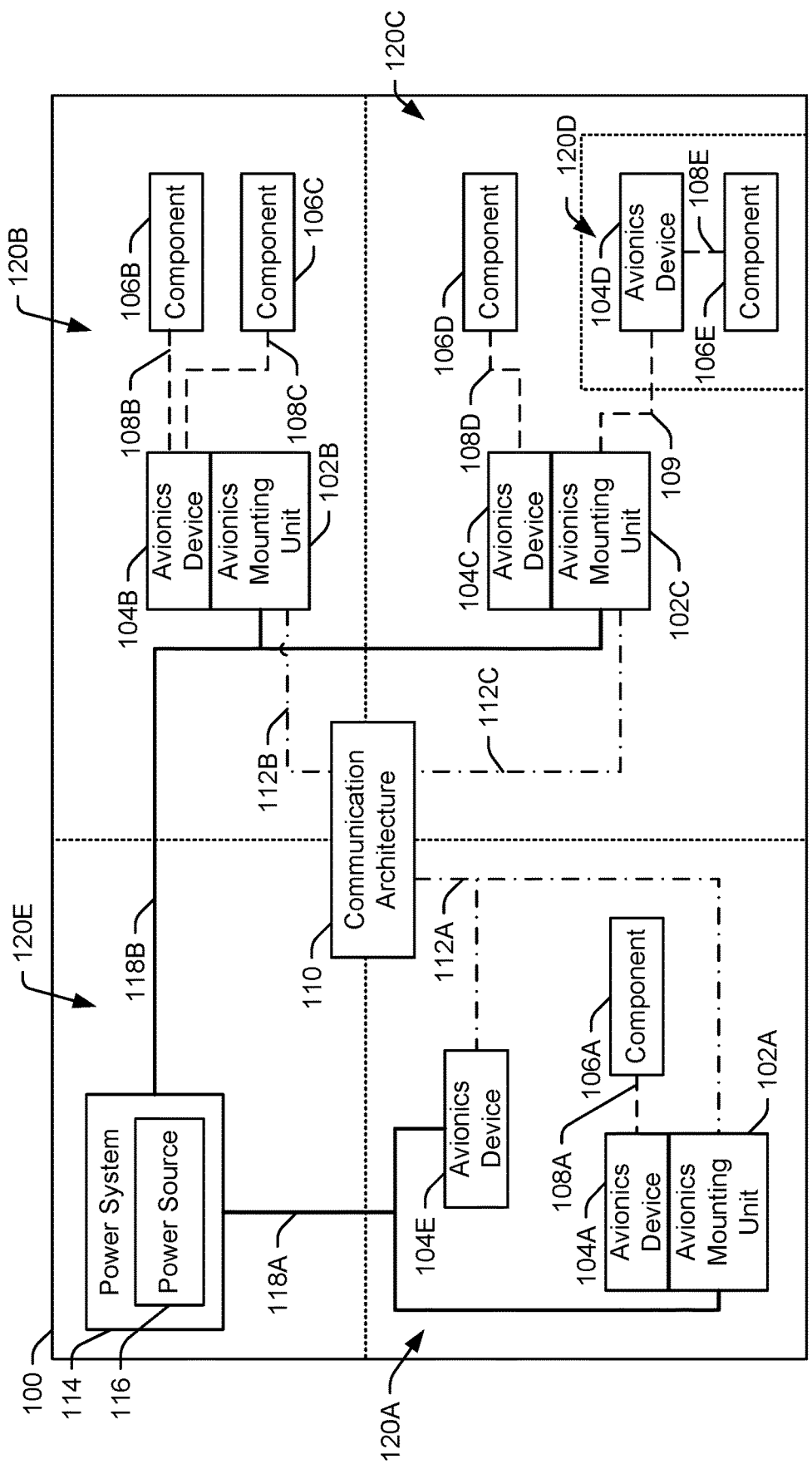
FIG. 1 is a block diagram that illustrates an example of an aircraft including a reconfigurable avionics system.

To address adding new technologies, a mechanism to simplify modification by using a combination of avionics mounting units with attachable and detachable avionics devices will significantly reduce integration challenges. Particular implementations are described herein with reference to the drawings. In the description, common features are designated by common reference numbers throughout the drawings. In some drawings, multiple instances of a particular type of feature are used. Although these features are physically and/or logically distinct, the same reference number is used for each, and the different instances are distinguished by addition of a letter to the reference number. When the features as a group or a type are referred to herein (e.g., when no particular one of the features is being referenced), the reference number is used without a distinguishing letter. However, when one particular feature of multiple features of the same type is referred to herein, the reference number is used with the distinguishing letter. For example, referring to FIG. 1, multiple avionics devices are illustrated and associated with reference numbers 104A, 104B, 104C, 104D, and 104E. When referring to a particular avionics device, such as the avionics device 104A, the distinguishing letter "A" is used. However, when referring to any arbitrary avionics device or set of avionics devices, the reference number 104 is used without a distinguishing letter.

As used herein, various terminology is used for the purpose of describing particular implementations only and is not intended to be limiting. For example, the singular forms "a," "an," and "the" are intended to include the plural forms as well, unless the context clearly indicates otherwise. Further, the terms "comprise," "comprises," and "comprising" are used interchangeably with "include," "includes," or "including." Additionally, the term "wherein" is used interchangeably with the term "where." As used herein, "exemplary" indicates an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to a grouping of one or more elements, and the term "plurality" refers to multiple elements.

As used herein, "generating", "calculating", "using", "selecting", "accessing", and "determining" are interchangeable unless context indicates otherwise. For example, "generating", "calculating", or "determining" a parameter (or a signal) can refer to actively generating, calculating, or determining the parameter (or the signal) or can refer to using, selecting, or accessing the parameter (or signal) that is already generated, such as by another component or device. Additionally, "adjusting" and "modifying" can be used interchangeably. For example, "adjusting" or "modifying" a parameter can refer to changing the parameter from a first value to a second value (a "modified value" or an "adjusted value"). As used herein, "coupled" can include "communicatively coupled," "electrically coupled," or "physically coupled," and can also (or alternatively) include any combinations thereof. Two devices (or components) can be coupled (e.g., communicatively coupled, electrically coupled, or physically coupled) directly or indirectly via one or more other devices, components, wires, buses, networks (e.g., a wired network, a wireless network, or a combination thereof), etc. Two devices (or components) that are electrically coupled can be included in the same device or in different devices and can be connected via electronics, one or more connectors, or inductive coupling, as illustrative, non-limiting examples. In some implementations, two devices (or components) that are communicatively coupled, such as in electrical communication, can send and receive electrical signals (digital signals or analog signals) directly or indirectly, such as via one or more wires, buses, networks, etc. As used herein, "directly coupled" is used to describe two devices that are coupled (e.g., communicatively coupled, electrically coupled, or physically coupled) without intervening components In a particular implementation, an aircraft includes a reconfigurable avionics system. The reconfigurable avionics system uses a common backbone infrastructure of the aircraft and end systems (referred to herein as avionics mounting units) that interface avionics devices to the common backbone infrastructure. The common backbone infrastructure includes systems and devices to enable data communications and to supply power to the avionics mounting units and the avionics devices. Using the reconfigurable avionics system described herein can reduce the weight of the aircraft, as compared to conventional avionics systems, by decreasing a number and length of wire/cable runs and by position end system modules (e.g., avionics mounting units) within zones of the aircraft associated with multiple avionics devices. Implementations disclosed herein also reduce the complexity of aerospace system integration. Reducing the complexity of aerospace system integration decreases the time and cost associated with reconfiguring devices within an aircraft, adding new devices to the aircraft, maintaining and/or upgrading the aircraft, customizing the aircraft to customer requirements, etc.

Each avionics mounting units includes circuitry to power one or more avionics devices, circuitry to communicate with the one or more avionics devices, and circuitry to communicate, via the common backbone infrastructure, with other systems of the aircraft. In some implementations, an avionics mounting unit can also include other circuitry, such as input/output (I/O) circuitry to receive user input (e.g., a maintenance query, a software update, etc.), to generate output (e.g., a responsive to a maintenance query, a status indication, etc.), processing circuitry (e.g., to provide data firewalling and/or routing operations, health monitoring, power management or other functions), or a combination thereof.

In a particular implementation, an avionics mounting unit includes a housing configured to physically attach to a structure of an aircraft and to physically attach to one or more avionics devices. For example, the avionics mounting unit can include a mounting interface to couple to the aircraft via one or more fasteners, and another mounting interface (on a different side of the housing) to couple to one or more avionics devices. As explained further below, the mounting interface for avionics device can be configured according to a standard format so that the mounting interface is compatible with many different types and configurations of avionics devices.

Each avionics mounting unit also includes one or more ports (referred to herein as avionics device interface ports) to electrically connect circuitry of the avionics mounting unit to an avionics device (or another component) and one or more ports (referred to herein as aircraft interface ports) to electrically connect the circuitry of the avionics mounting unit to the common infrastructure backbone of the aircraft. For ease of reconfiguration, in some implementations, the ports are configured to use standard connectors and external wire harnesses to interconnect the avionics device to the avionics mounting unit. For example, an avionics mounting unit can be electrical coupled to an avionics device via one or more wire harnesses, with each wire harness connected to a port of the avionics mounting unit and a port of the avionics device via standard round connectors (e.g., cannon plugs).

FIG. 1 is a block diagram that illustrates an example of an aircraft 100 that includes a reconfigurable avionics system. The reconfigurable avionics system includes one or more avionics mounting units 102, such as avionics mounting units 102A, 102B, and 102C, positioned at various locations around the aircraft 100. In FIG. 1, the various locations are illustrated as different zones 120 (including zones 120A, 120B, 120C, 120D, and 120E separated by small dotted lines in FIG. 1). The zones 120 are illustrated to show that avionics mounting units 102 can service many different parts of the aircraft. In FIG. 1, a particular zone 120 can be separated from an adjacent zone 120 by a physical structure of the aircraft 100 (such as a bulkhead), by logical distinction (e.g., between flight critical equipment and nearby passenger convenience equipment), or both. As a particular example, the zones 120 can include a passenger compartment, a cockpit, a cargo hold, an equipment bay, etc.

The aircraft 100 includes a power system 114 including at least one power supply, such as a power source 116. The power system 114 can also include power management and power distribution components (not shown) such as switches, breakers, fuses, power converters, etc. The power source 116 can include or correspond to a generator, a fuel cell, a battery, a photoelectric array, another device that outputs electrical power derived from a fuel supply, an external source, or a combination thereof. In a typical example, the power source 116 can include an engine driven generator and one or more batteries. The power system 114 is coupled to devices throughout the aircraft 100 via a power distribution system, including power lines 118 (including power lines 118A and 118B). Although FIG. 1 illustrates only one power system 114 including one power source 116, in many implementations the aircraft 100 will include more than one power system 114 (e.g., several redundant or concurrently operating power systems), and each power system 114 will include one or more power sources 116.

The aircraft 100 also includes a communication architecture 110 coupled to various devices of the aircraft 100 via communication lines 112, such as communication lines 112A, 112B, and 112C. The communication architecture 110 can include devices to facilitate routing signals and/or data between devices of the aircraft 100. For example, the communication architecture 110 can include one or more gateway devices, one or more data routers or switches, one or more firewall devices, or other devices to facilitate digital or packet-based data communications. In other examples, the communication architecture 110 can also include one or more devices to facilitate communications that are not packet-based, such as analog signals, pulse-width modulated signals, clock signals, etc.

The aircraft 100 also includes multiple avionics devices 104, such as the avionics devices 104A, 104B, 104C, 104D, and 104E. The avionics devices 104 provide various functions to support operation of the aircraft 100 or a mission of the aircraft 100. As non-limiting examples, the avionics devices 104 can support operations such as flight control, flight data management and recording, navigation, communications (within and external to the aircraft 100), collision avoidance, crew management and display of information to crew, aircraft health, and many others.

In some implementations, one or more of the avionics devices 104 is coupled to another component 106 associated with functionality of the avionics device 104. For example, in FIG. 1, the avionics device 104A is coupled to a component 106A via line 108A, the avionics device 104B is coupled to a component 106B via line 108B and to a component 106C via line 108C, the avionics device 104C is coupled to a component 106D via line 108D, and the avionics device 104D is coupled to a component 106E via line 108E. The lines 108 can be configured to provide power from respective avionics devices 104 to corresponding components 106, data from respective avionics devices 104 to corresponding components 106, data from respective components 106 to corresponding avionics devices 104, or a combination thereof. For example, one or more of the components 106 can include a sensor, an antenna, a probe, or another device that is configured to provide a signal (e.g., an analog or digital signal) representing information to the avionics device 104. In this example, the avionics device 104 modifies the signal, or the avionics device 104 uses the signal to perform a calculation, to access data, or to generate another signal. The avionics device 104 can communicate the signal, information represented by the signal, or results of an operation performed by the avionics device 104 to other aircraft systems, such as to another avionics device 104.

In another example, one or more of the components 106 can include an actuator or a controlled device. In this example, the avionics device 104 provides a signal or command to the component 106, and the component 106 performs an operation responsive to the signal or command. To illustrate, the component 106 can be an actuator that moves a flight surface responsive to a command or signal from the avionics device 104. In this example, the component 106 can provide a feedback signal (such as a position signal) to the avionics device 104. The avionics device 104 can determine the signal or the command based on information received from another avionics device 104, based on a calculation or determination performed by the avionics device 104 itself, based on other input (such as input via an I/O port), or a combination thereof. As illustrated in FIG. 1, some avionics devices 104, such as the avionics device 104B, can be coupled to and interact with more than one component 106, such as components 106B and 106C. As is also illustrated in FIG. 1, some avionics devices 104, such as the avionics device 104E, are not directly coupled to a component 106.

In a particular implementation, one or more of the avionics devices 104 are coupled to the power source 116, the communication architecture 110, or both, via an avionics mounting unit 102, such as avionics mounting units 102A, 102B, and 102C. Each avionics mounting unit 102 is coupled, via a first mounting interface, to a respective structure (such as structure 702 of FIG. 7) of the aircraft 100. Additionally, each avionics mounting unit 102 includes a second mounting interface configured to retain one or more avionics devices. To illustrate, as further described below, the second mounting interface of an avionics mounting unit 102 can include a plurality of slots including first slots and second slots arranged orthogonally to the first slots. As explained further below, such an arrangement of slots can enable coupling an avionics device 104 to an avionics mounting unit 102 from multiple directions, such as from any of four sides of the avionics mounting unit 102. Further, the slots can be spaces apart and dimensioned to conform to standard form factors of avionics devices. Thus, the second mounting interface is compatible with a large number of sizes, shapes, and types of avionics devices 104 to enable each of the avionics mounting units 102 to work with many avionics devices 104.

In addition to physically retaining avionics devices 104, the avionics mounting units 102 are configured to enable operation of and interoperability of the avionics devices 104. For example, each of the avionics mounting units 102 includes communication circuitry, power supply circuitry, processing circuitry, or a combination thereof. As explained further with reference to FIG. 2, the communications circuitry is configured to enable the avionics mounting unit 102 and an avionics device 104 coupled to the avionics mounting unit 102 to exchange signals and data. The communications circuitry is also configured to enable the avionics mounting unit 102 to communicate with other aircraft systems via the communication architecture 110. In a particular implementation, the communication circuitry is configured to convert between communication formats and protocols. To illustrate, the communication architecture 110 can use one or more standard aircraft communication protocols. In this illustrative example, the communication circuitry can receive data from an avionics device 104 in a different format or according to a different protocol, and the communication circuitry can convert the data into one of the one or more standard aircraft communication protocols for communication via the communication architecture 110.

The power supply circuitry is configured to receive power from the power source 116 and to provide power to an avionics device 104 coupled to the avionics mounting unit 102. The processing circuitry is configured to provide data processing and/or complex communication operations. To illustrate, the processing circuitry can include a memory to store a look up table or another data structure, and the processing circuitry can be configured to receive data or a signal from an avionics device 104 coupled to the avionics mounting unit 102, to perform a data look up operation based on the data or signal, and to send a result of the data look up operation to another aircraft system via the communication architecture 110.

Thus, the avionics mounting units 102 simplify customization of or reconfiguration of avionics of the aircraft 100. For example, when the aircraft 100 is manufactured, one or more custom avionics devices 104 can be installed on the aircraft 100 using the avionics mounting units 102. The custom avionics devices 104 can provide mission specific operations or can simply be selected by a customer from a menu of allowable options. Such simple customization can greatly reduce manufacturing costs. Similarly, after the aircraft 100 is manufactured, one or more of the avionics devices 104 can be upgraded, removed, or replaced quickly due to the simple physical and electrical connections between the avionics mounting units 102 and the avionics devices 104. Further, even the communication architecture 110 can be upgraded more easily due to use of the avionics mounting units 102. For example, to implement a new communication protocol using the communication architecture 110, one or more devices of the communication architecture 110 (such as one or more routers or switches) can be upgraded or replaced and one or more of the avionics mounting units 102 can be updated. Since each avionics mounting unit 102 can provide communication interface operations for multiple avionics devices 104, every avionics device 104 of the aircraft 100 does not have to be upgraded in order to use the new communication protocol.

Figure 2:
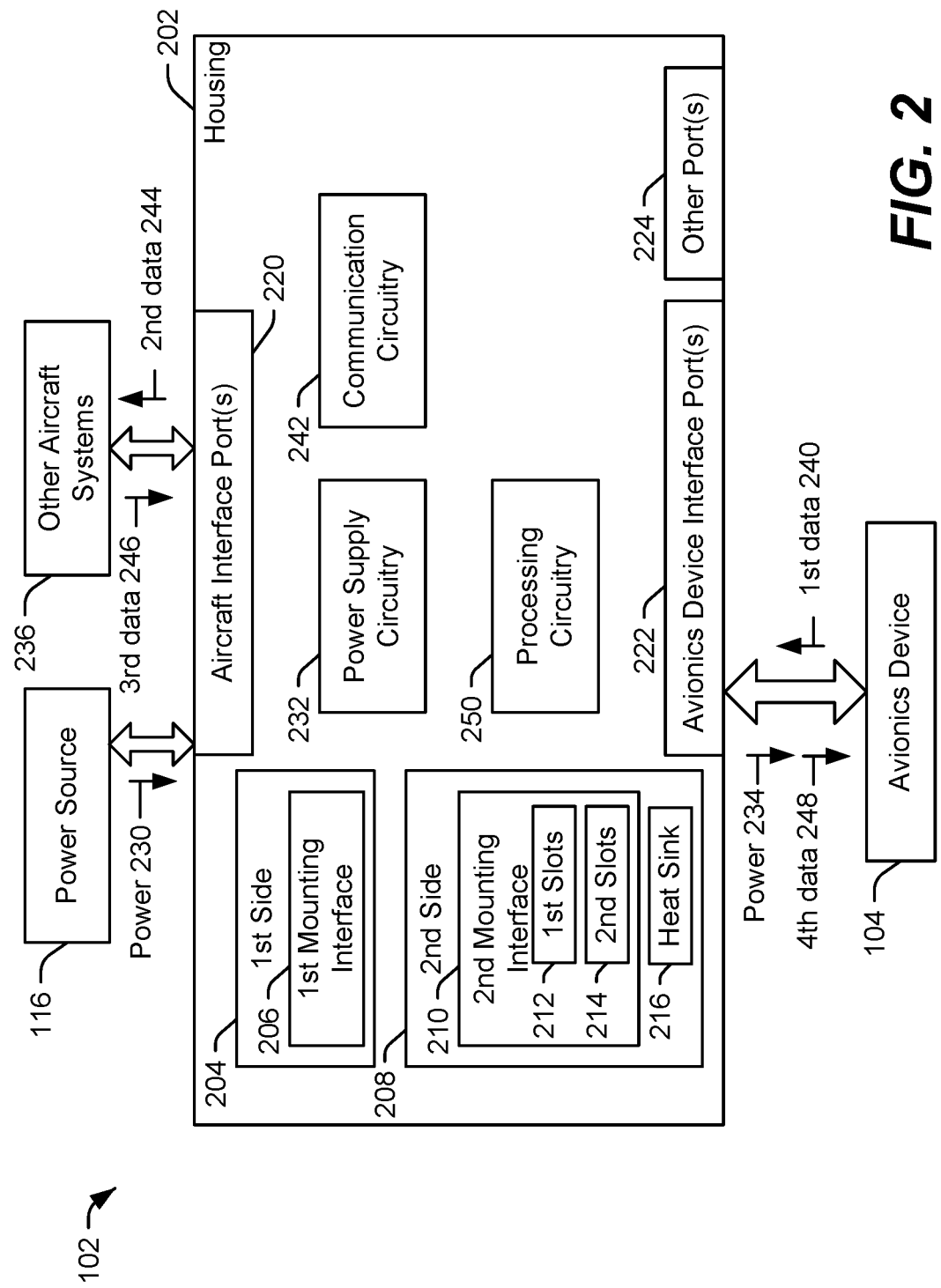
FIG. 2 is a block diagram that illustrates a portion of an aircraft of FIG. 1, including an avionics mounting unit.

FIG. 2 is a block diagram that illustrates a portion of the aircraft 100 of FIG. 1, including an avionics mounting unit 102. In FIG. 2, the avionics mounting unit 102 is coupled to the power source 116, to an avionics device 104, and to other aircraft systems 236. The other aircraft systems 236 can include or correspond to another avionics mounting unit, another avionics device, a component of the communication architecture 110 of FIG. 1, another device or aircraft component, or a combination thereof.

The avionics mounting unit 102 includes a housing 202 that includes multiple sides, including a first side 204 and a second side 208. The first side 204 includes a first mounting interface 206 to couple the avionics mounting unit 102 to a structure of the aircraft 100. The second side 208 include a second mounting interface 210 to retain one or more avionics devices, such as the avionics device 104. The second mounting interface 210 include first slots 212 and second slots 214. The first slots 212 are arranged orthogonally to the second slots 214 and positioned such that the avionics device 104 can be coupled to the avionics mounting unit 102 from any of four sides of the avionics mounting unit 102. In some implementations, the four sides from which the avionics device 104 can be coupled to the avionics mounting unit 102 include the first side 204; however, in other implementations, the four sides do not include the first side 204. In the implementation illustrated in FIG. 2, the housing 202 also includes a heat sink 216 on the second side 208. In other implementations, the housing 202 includes other heat sinks, such as a heat sink on the first side 204 or on another side.

The avionics mounting unit 102 includes various circuitry within the housing 202 to enable operation of the avionics device 104 and interoperation of the avionics device 104 with the other aircraft systems 236. For example, in FIG. 2, the housing 202 at least partially encloses power supply circuitry 232, communication circuitry 242, and processing circuitry 250. The avionics mounting unit 102 also includes various ports, coupled to the housing 202, to enable electrical interconnection to the circuitry within the housing 202. For example, in FIG. 2, the ports include aircraft interface ports 220, avionics device interface ports 222, and other ports 224.

The power supply circuitry 232 is configured to receive power 230 from the power source 116 via the aircraft interface ports 220 and to provide power 234 to the avionics device 104 via the avionics device interface ports 222. To this end, the power supply circuitry 232 includes power management circuitry, power conversion circuitry, power sequencing/load shedding circuitry, other circuitry to adapt the power 230 from the power source 116 for use by the avionics device 104, or a combination thereof. As an example, the power supply circuitry 232 can include a DC-to-DC converter to receive the power 230 at a first voltage and provide the power 234 to the avionics device 104 at a second voltage. In other examples, the power supply circuitry 232 can include other power conversion circuits, such as an AC-to-AC converter, an AC-to-DC converter, or a DC-to-AC converter. In addition to converting the power 230 into the power 234 for use by the avionics device 104, the power supply circuitry 232 can control the power 234 provided to the avionics device 104 in other ways. To illustrate, the power supply circuitry 232 can include a breaker or fuse to disconnect the avionics device 104 from the power 234 in the event of an unusual circumstance (such as a power surge).

The power supply circuitry 232 can also be configured to automatically detect power requirements of the avionics device 104 and to provide the power 234 according to the power requirements of the avionics device 104. As a simple example, a pin-out of a wire harness used to couple the avionics device 104 to one of the avionics device interface ports 222 can correspond to or indicate the power requirements of the avionics device 104. To illustrate, shorting two pins of a connector of the wire harness together may indicate to the power supply circuitry 232 that the avionics device 104 requires 12 VDC at 1.5 amps. In a more complex arrangement, the avionics device 104 can include an onboard memory that stores data indicating the power requirements, and the power supply circuitry 232 can include a processing circuit that is configured to access the memory, via the avionics device interface ports 222, to determine the power requirements of the avionics device 104 in response to detecting that the avionics device 104 is coupled to one of the avionics device interface ports.

The communication circuitry 242 is configured to receive and transmit data via the aircraft interface ports 220 and to receive and transmit data via the avionics device interface ports 222. To this end, the communication circuitry 242 includes circuitry to receive signals encoding data (e.g., receivers), circuitry to generate signals encoding data (e.g., transmitters), circuitry to implement one or more communication protocols, and circuitry to perform operations to convert between communication protocols. In some implementations, the communication circuitry 242 can be capable of receiving data using a wide variety of techniques. For example, the communication circuitry 242 can include circuitry to receive analog signals, pulse-width modulated signals, timing/synchronization signals, binary signals, etc. The communication circuitry 242 can also receive data encoded and communicated according to a wide variety of communication protocols and standards, such as according to an Aeronautical Radio INC (ARINC) 429 specification, an ARINC 500 series specification, an ARINC 600 series specification, an ARINC 700 series specification, an ARINC 800 series specification, an Ethernet specification, I2C specification, a SMBus specification, a CanBus specification, an RS485 specification, or another specification for wired, wireless, or optical communications.

In a particular implementation, the communication circuitry 242 operates as a gateway to receive data (such as first data 240) in a first format from the avionics device 104 via the avionics device interface ports 222, to reformat the data (if needed), and to send the data (as second data 244 in a second format) to the other aircraft systems 236 via the aircraft interface ports 220. Depending on the communications techniques used by the avionics device 104 and the other aircraft systems 236, the second format of the second data 244 can be the same as the first format of the first data 240 (in which case the communication circuitry 242 behaves more or less like a router or switch), or the second format can be different from the first format (in which case the communication circuitry 242 performs operations such as transcoding, sampling, depacketization, encapsulation, etc. to generate the second data 244). The communication circuitry 242 is also configured to receive data (such as third data 246) in a third format from the other aircraft systems 236 via the aircraft interface ports 220, to reformat the data (if needed), and to send the data (as fourth data 248 in a fourth format) to avionics device 104 via the avionics device interface ports 222. As explained above regarding the first data 240 and the second data 244, operations performed to reformat the data vary depending on the specific configuration of the avionics devices 104 and the other aircraft systems 236.

The processing circuitry 250 is configured to control operation of the avionics mounting unit 102, and may also perform other operations, such as assisting the communication circuitry 242 with complex data conversion operations (if needed), monitoring the health and operation of the avionics device 104 and the avionics mounting unit 102, and providing a maintenance or control interface to the avionics mounting unit 102. The processing circuitry 250 includes a processing circuit and a memory storing instructions that are executable by the processing circuit to control the various operations of the avionics mounting unit 102. For example, the processing circuitry 250 can be coupled to the power supply circuitry 232 to control power conversion operations performed by the power supply circuitry 232. As another example, the processing circuitry 250 can be coupled to the communication circuitry 242 to control data transcoding or protocol stack selection operations performed by the communication circuitry 242.

In some implementations, the avionics mounting unit 102 includes other ports 224 in addition to the aircraft interface ports 220 and the avionics device interface ports 222. The other ports 224 can include I/O ports, maintenance ports, etc., that enable a technician to access the processing circuitry 250 directly (e.g., without going through the avionics device 104 or the other aircraft system 236). In such implementations, the technician can use the other ports 224 to extract data from the avionics mounting unit 102, such as the data 240, 244, 246, 248, or other data, such as health data associated with the avionics device 104 or the avionics mounting unit 102. Further, in such implementations, the technician can update or modify software associated with the avionics mounting unit 102 via the other ports 224. To illustrate, if the avionics device 104 is configured to send the first data 240 according a communication protocol that avionics mounting unit 102 is unable to process, the technician can upload instructions (such as transcoding instruction, a communication protocol stack, etc.) to the avionics mounting unit 102 via the other ports 224 to enable the avionics mounting unit 102 to process the communication protocol.

Figure 3:
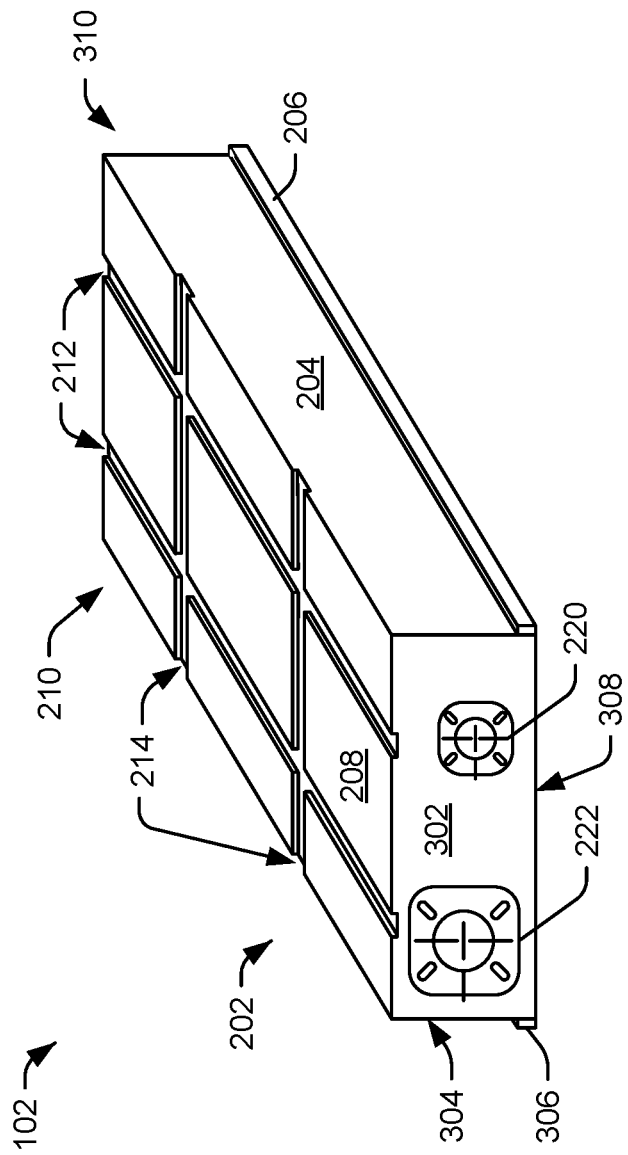
FIG. 3 is a diagram that illustrates a perspective view of an example of the avionics mounting unit of FIG. 2.
Figure 4:
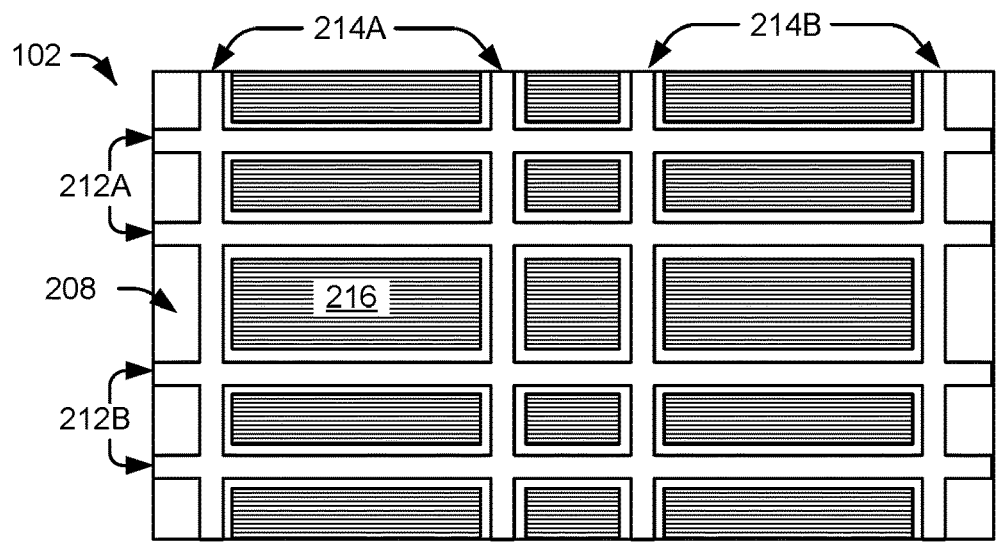
FIG. 4 is a diagram that illustrates a top view of an example of the avionics mounting unit of FIG. 2.
Figure 5:
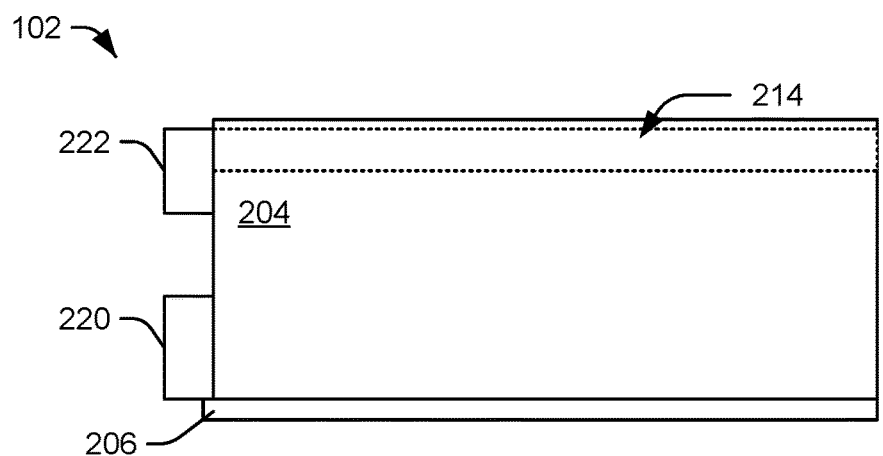
FIG. 5 is a diagram that illustrates a side view of an example of the avionics mounting unit of FIG. 2.
Figure 6:
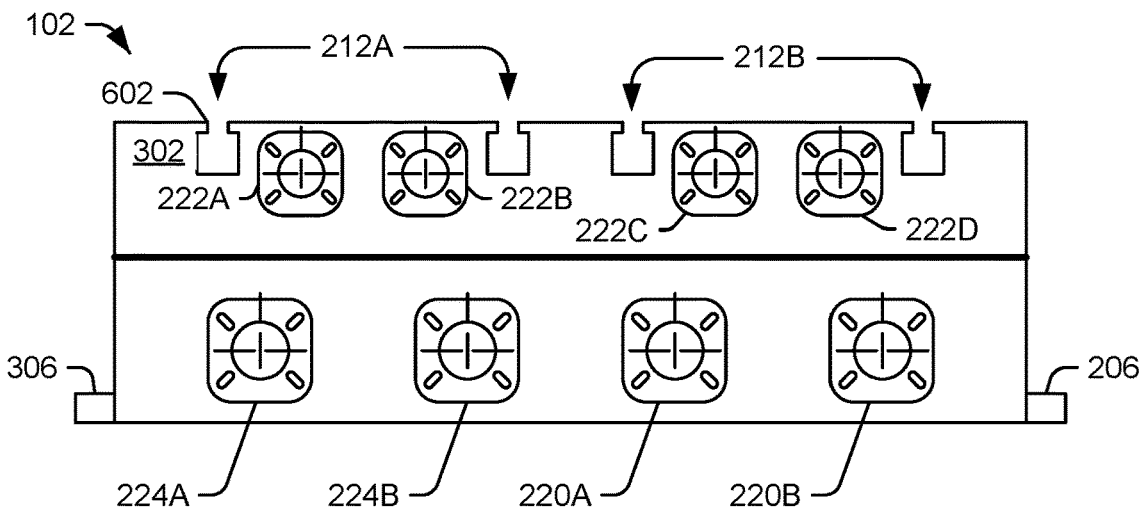
FIG. 6 is a diagram that illustrates a front view of an example of the avionics mounting unit of FIG. 2.

FIGS. 3-6 are diagrams illustrating several views of examples of the avionics mounting unit 102 of FIGS. 1 and 2. In particular, FIG. 3 is a diagram that illustrates a perspective view of a first example of the avionics mounting unit 102, FIG. 4 is a diagram that illustrates a top view of a second example of the avionics mounting unit 102, FIG. 5 is a diagram that illustrates a side view of the second example of the avionics mounting unit 102, and FIG. 6 is a diagram that illustrates a front view of the second example of the avionics mounting unit 102.

The perspective view of FIG. 3 illustrates some details of the housing 202 of the avionics mounting unit 102 according to a particular implementation. In FIG. 3, the first side 204 (e.g., the right side as illustrated in FIG. 3), the second side 208 (e.g., the top side as illustrated in FIG. 3), and a third side 302 (e.g., the front side as illustrated in FIG. 3) are visible. The housing 202 also includes a fourth side 308 (e.g., the bottom side as illustrated in FIG. 3), a fifth side 304 (e.g., the left side as illustrated in FIG. 3), and a sixth side 310 (e.g., the back side as illustrated in FIG. 3), which are not visible in the perspective view. In FIGS. 3-6, the first side 204 is illustrated as adjacent to the second side 208; however, in other implementations, the first side 204 is opposite to (rather than adjacent to) the second side 208. For example, in such implementations, the first side 204 is the bottom side in the view illustrated in FIG. 3.

The first side 204 includes the first mounting interface 206, which in the example shown in FIG. 3 is a flange to physically couple the avionics mounting unit 102 to a structure of the aircraft 100 of FIG. 1. In other implementations, the first mounting interface 206 can include other structures. In FIG. 3, the fifth side 304 also includes a mounting interface 306 (e.g., a flange) to couple the avionics mounting unit 102 to the aircraft structure.

FIG. 3 also shows an aircraft interface port 220 and an avionics device interface port 222 on the third side 302 of the housing 202. Other implementations include more than one the avionics device interface ports 222, more than one aircraft interface ports 220, the other ports 224 of FIG. 2, or a combination thereof. Further, in some implementations, the ports are positioned on different sides of the housing. For example, one or more aircraft interface ports 220 and one or more avionics device interface ports 222 can be located on the first side 204, on the fifth side 304, or on the sixth side 310 in addition to or instead of on the third side 302. In another example, one or more aircraft interface ports 220 can be located on the first side 204, on the third side 302, on the fifth side 304, or on the sixth side 310, and the one or more avionics device interface ports 222 can be located on a different side than the one or more aircraft interface ports 220.

The second side 208 includes the second mounting interface 210. As illustrated in FIG. 3, the second mounting interface 210 includes first slots 212 extending across the second side 208 between the sixth side 310 and the third side 302. The second mounting interface 210 also includes second slots 214 extending across the second side 208 between the first side 204 and the fifth side 304. Further, the second slots 214 are orthogonal to and intersect the first slots 212. The first slots 212 enable coupling an avionics device 104 to the avionics mounting unit 102 from a direction of the third side 302 or from a direction of the sixth side 310. Likewise, the second slots 214 enable coupling an avionics device 104 to the avionics mounting unit 102 from a direction of the first side 204 or from a direction of the fifth side 304. Thus, the first slots 212 and second slots 214, collectively, enable mounting the avionics device 104 to the avionics mounting unit 102 from any of four sides (e.g., the first side 204, the third side 302, the fifth side 304, and the sixth side 310) of the housing 202.

In a particular implementation, the first slots 212 and the second slots 214 are configured to couple to avionics devices 104 that conform to standard Air Transport Rack (ATR) dimensions. For example, ATR dimensions define, among other parameters, lengths and widths of ATR-compliant avionics devices. In this context, "length" refers to a dimension of the avionics device 104 along a direction between the third side 302 and the sixth side 310 (e.g., parallel to the first slots 212), and "width" refers to a dimension of the avionics device 104 along a direction between the first side 204 and the fifth side 304 (e.g., parallel to the second slots 214). Typical ATR lengths and widths are illustrated in Table 1 below.

TABLE 1

| ATR Size | Width in inches (tolerance +/− 0.03 inches) | Length in inches (tolerance +/− 0.04 inches) |
|---|---|---|
| Dwarf | 2.25 | 12.52 |
| ¼ Short | 2.25 | 12.52 |
| ⅜ Short | 3.56 | 12.52 |
| ⅜ Long | 3.56 | 19.52 |
| ½ Short | 4.88 | 12.52 |
| ½ Long | 4.88 | 19.52 |
| ¾ Short | 7.5 | 12.52 |
| ¾ Long | 7.5 | 19.52 |
| 1 Short | 10.12 | 12.52 |
| 1 Long | 10.12 | 19.52 |
| 1½ | 15.38 | 19.52 |

In some implementations, the first slots 212 and the second slots 214 are configured to couple to avionics devices 104 that conform to small form factor (SFF) dimensions. According to a particular implementation, SFF lengths and widths are set up in increments of about 1.6 inches. To illustrated, a particular SFF device may have a length of about 4.8 inches, and a next size up SFF device may have a length of about 6.4 inches. In other implementations, the first slots 212 and second slots 214 are spaced apart and dimensioned to accommodate avionics devices 104 with other dimensions.

Referring to FIG. 4, a top view of another example of an avionics mounting unit 102 is shown. In FIG. 4, the avionics mounting unit 102 includes multiple sets of slots arranged in each direction. Specifically, the avionics mounting unit 102 of FIG. 4 includes a first pair of first slots 212A, a second pair of first slots 212B, a first pair of second slots 214A, and a second pair of second slots 214B. In other implementations, the avionics mounting unit 102 can include different numbers of first slots 212 (e.g., two first slots 212, three first slots 212, five first slots 212, six first slots 212, or more). Likewise, in other implementations, the avionics mounting unit 102 can include different numbers of second slots 214 (e.g., two second slots 214, three second slots 214, five second slots 214, six second slots 214, or more). Further, the avionics mounting unit 102 can include a different number of first slots 212 than second slots 214.

FIG. 4 also illustrates the heat sink 216 on the second side 208. In the particular implementation illustrated in FIG. 4, the heat sink 216 includes multiple fins to enable passive or active cooling of the avionics mounting unit 102. In the particular example illustrated in FIG. 4, fins of the heat sink 216 are positioned between the slots 212, 214 on the second side 208.

FIG. 5 shows a side view and FIG. 6 shows a front view of the avionics mounting unit 102 according to a particular implementation. In FIG. 5, one avionics device interface port 222 and one aircraft interface port 220 are visible. However, as seen in FIG. 6, the avionics mounting unit 102 can include multiple avionics device interface ports 222, including avionics device interface ports 222A, 222B, 222C, and 222D. Likewise, the avionics mounting unit 102 can include multiple aircraft interface ports 220, including aircraft interface ports 220A and 220B. Further, the avionics mounting unit 102 can include one or more other ports 224, including other ports 224A and 224B In the particular implementation illustrated in FIGS. 5 and 6, each of the slots 212, 214 includes a lip or ledge 602. As better seen in FIGS. 7-9, an avionics device 104 can be coupled to the slots 212, 214 via a flange of the avionics device 104 and a wedge-type fastener (also referred to herein as a "wedge lock" fastener). The wedge lock fastener biases the flange of the avionics device 104 into contact with the ledges 602 to couple the avionics device 104 to the housing 202.

Figure 7:
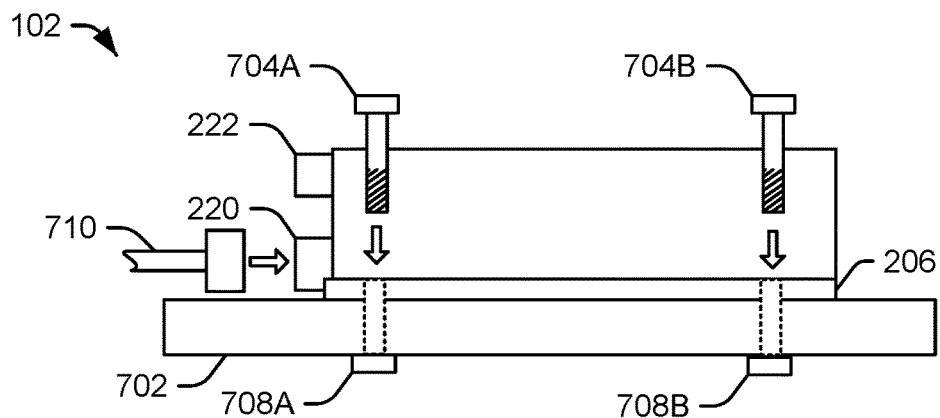
FIG. 7 is a diagram that illustrates mounting an example of the avionics mounting unit of FIG. 2 to a structure of an aircraft.
Figure 8:
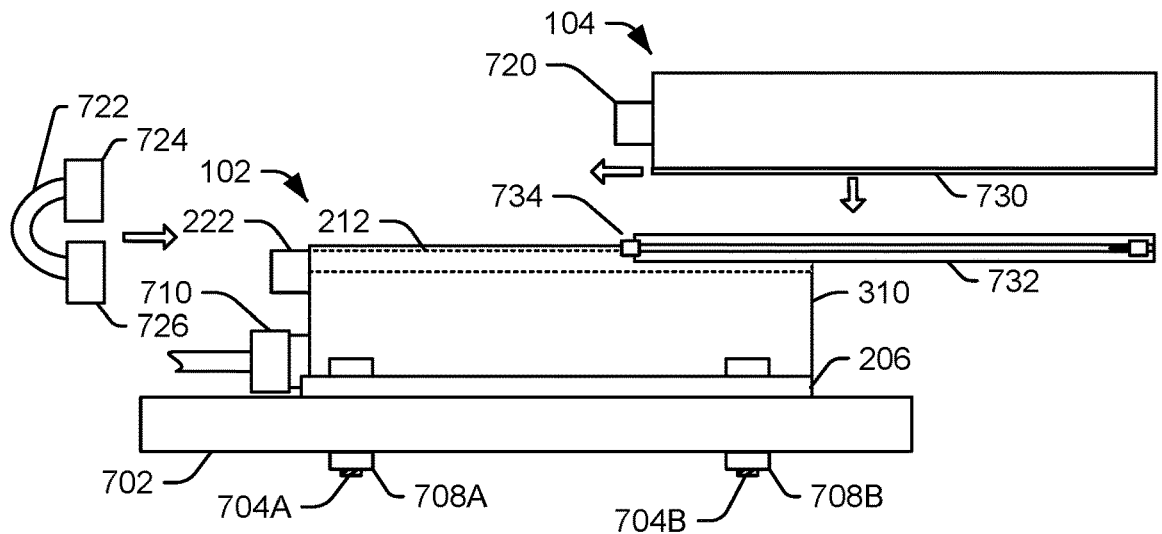
FIG. 8 is a diagram that illustrates mounting an avionics device to the avionics mounting unit of FIG. 7.
Figure 9:
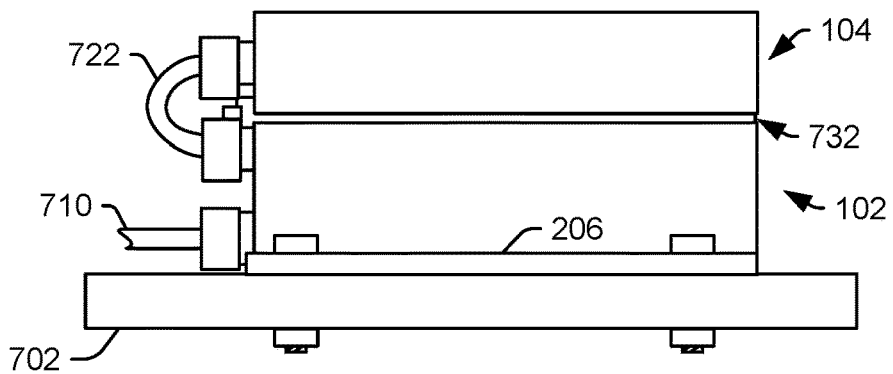
FIG. 9 is a diagram that illustrates a side view of the avionics device and the avionics mounting unit of FIGS. 7 and 8 after mounting the avionics device to the avionics mounting unit.

FIGS. 7-9 illustrate various stages of a process of mounting the avionics mounting unit 102 to a structure of an aircraft and mounting the avionics device 104 to the avionics mounting unit 102. In FIG. 7, the avionics mounting unit 102 is coupled to a structure 702 of the aircraft 100 using a plurality of fasteners. In the particular example illustrated in FIG. 7, the first mounting interface 206 includes a flange on the housing 202 of the avionics mounting unit 102, and the fasteners include bolts 704A, 704B and nuts 708A, 708B. In other implementations, different fasteners can be used in addition to or instead of the bolts 704 and the nuts 708. To illustrate, the fasteners can include clips, screws, pins, or other mechanical fasteners.

FIG. 7 also illustrates coupling a wire harness 710 to one of the aircraft interface ports 220. The wire harness 710 can couple the avionics mounting unit 102 to the power source 116 of FIG. 1, to the communication architecture 110 of FIG. 1 (e.g. to an aircraft communications network connection), or both. In some implementations, additional wire harnesses (not shown) are coupled to other aircraft interface ports 220 to power the avionics mounting unit 102, to enable the avionics mounting unit 102 to communication with other aircraft systems via the communication architecture 110, or both.

FIG. 8 illustrates mounting the avionics device 104 to the avionics mounting unit 102 of FIG. 7 by sliding flanges 730 of the avionics device 104 and wedge lock fasteners 734 into first slots 212 of the avionics mounting unit 102. In the example illustrated in FIG. 8, the avionics device 104 and the wedge lock fastener 734 (only one of which is visible in the view illustrated in FIG. 8) slide into the first slots 212 from a direction corresponding to the sixth side 310; however, as explained above, the slots 212, 214 are arranged to enable the avionics device 104 to be coupled to the avionics mounting unit 102 from any of four sides.

FIG. 8 also illustrates coupling a first end 726 of a wire harness 722 (e.g., an external wire harness) to one of the avionics device interface ports 222 of the avionics mounting unit 102 and coupling a second end 724 of the wire harness 722 to a port 720 of the avionics device 104. In some implementations, additional wire harnesses (not shown) are coupled to other avionics device interface ports 222 and to other ports of the avionics device 104. The wire harness 722 enables data communications between the avionics device 104 and the avionics mounting unit 102, enables the avionics mounting unit 102 to provide power to the avionics device 104, or both.

FIG. 9 is a diagram that illustrates a side view of the avionics device 104 and the avionics mounting unit 102 of FIGS. 7 and 8 after the avionics device 104 is mounted to the avionics mounting unit 102. Although not illustrated in FIGS. 7-9, in some implementations, installing the avionics device 104 can also include electrically connecting the avionics device to one or more other devices, such as one or more of the components 106 of FIG. 1. Additionally or in the alternative, installing the avionics mounting unit 102 can include physically and/or electrically connecting the avionics mounting unit 102 to another avionics device. For example, in FIG. 1, the avionics mounting unit 102C is physically and electrically connected to the avionics device 104D and is electrically (but not physically) connected to the avionics device 104D via line 109.

Figure 10:
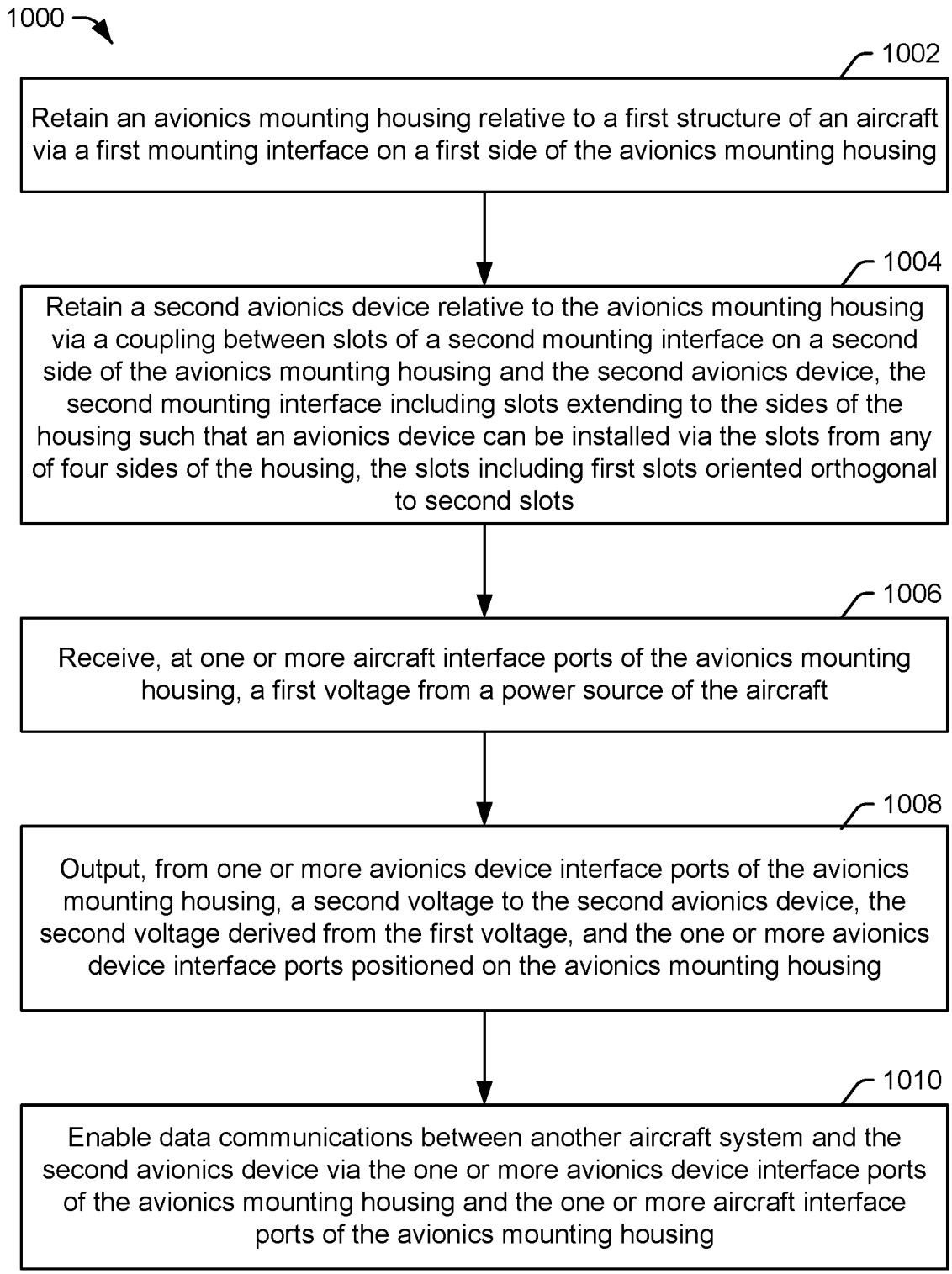
FIG. 10 is a flow chart of an example of a method of configuring reconfigurable avionics system of an aircraft.

FIG. 10 is a flow chart of an example of a method 1000 of configuring a reconfigurable avionics system of the aircraft 100 of FIG. 1. The method 1000 includes, at 1002, retaining an avionics mounting unit relative to a structure of an aircraft via a first mounting interface of a housing of the avionics mounting unit. For example, the avionics mounting unit 102 of FIGS. 1-9 can be coupled to the structure 702 of the aircraft 100 using a plurality of fasteners, as illustrated in FIG. 7.

The method 1000 also includes, at 1004, retaining an avionics device relative to the housing via a coupling between slots of a second mounting interface of the housing and the avionics device. For example, as illustrated in FIG. 8, a flange 730 or another portion of a housing of the avionics device 104 can be retained within a slot of the avionics mounting unit 102 by a fastener, such as the wedge lock fastener 734. As described above, the slots of the second mounting interface 210 including first slots 212 and second slots 214 oriented orthogonal to each other, and the first slots 212 and the second slots extend to sides of the housing 202 such that the avionics device 104 can be installed via the slots 212, 214 from any of four sides of the housing 202.

The method 1000 further includes, at 1006, receiving, at one or more aircraft interface ports of the avionics mounting unit, a first voltage from a power source of the aircraft. For example, the avionics mounting unit 102 can be coupled, via the wire harness 710, to the power source 116 of FIGS. 1 and 2 to receive the power 230. The power 230 can is provided according to particular power specifications based on the infrastructure of the aircraft (e.g., characteristics of the power source 116, characteristics of the power system 114, characteristics of the power lines 118, etc.). Among the particular power specifications is a voltage (e.g., the first voltage) of the power 230.

The method 1000 also includes, at 1008, outputting, from one or more avionics device interface ports of the avionics mounting unit, a second voltage to the avionics device, where the second voltage is derived from the first voltage. For example, the power supply circuitry 232 of the avionics mounting unit 102 can convert the power 230 to the power 234 that is provided to the avionics device 104. In some implementations, the operations performed by the power supply circuitry 232 to convert the power 230 to the power 234 includes converting a voltage of the power 230 (e.g., the first voltage) to a second voltage.

The method 1000 further includes, at 1010, enabling data communications between another aircraft system and the avionics device via the one or more avionics device interface ports of the avionics mounting unit and the one or more aircraft interface ports of the housing. For example, the communication circuitry 242 of the avionics mounting unit 102 can receive the first data 240 of FIG. 2 from the avionics device 104 and send the second data 244 (based on the first data 240) to the other aircraft systems 236. In this example, the avionics mounting unit 102 can receive a first input signal including first data 240 that can be in a first format, and the processing circuitry 250 or the communication circuitry 242 can process the first data 240 to generate an output signal including the second data 244 in a second format, where the second format is different from the first format and based on an aircraft network communication protocol.

As another example, the communication circuitry 242 of the avionics mounting unit 102 can receive the third data 246 from the other aircraft systems 236 of FIG. 2 and send the fourth data 248 (based on the third data 246) to avionics device 104. In this example, the third data 246 is in a third format, and the processing circuitry 250 or the communication circuitry 242 processes the third data 246 to generate the fourth data 248 in a fourth format.

Figure 11:
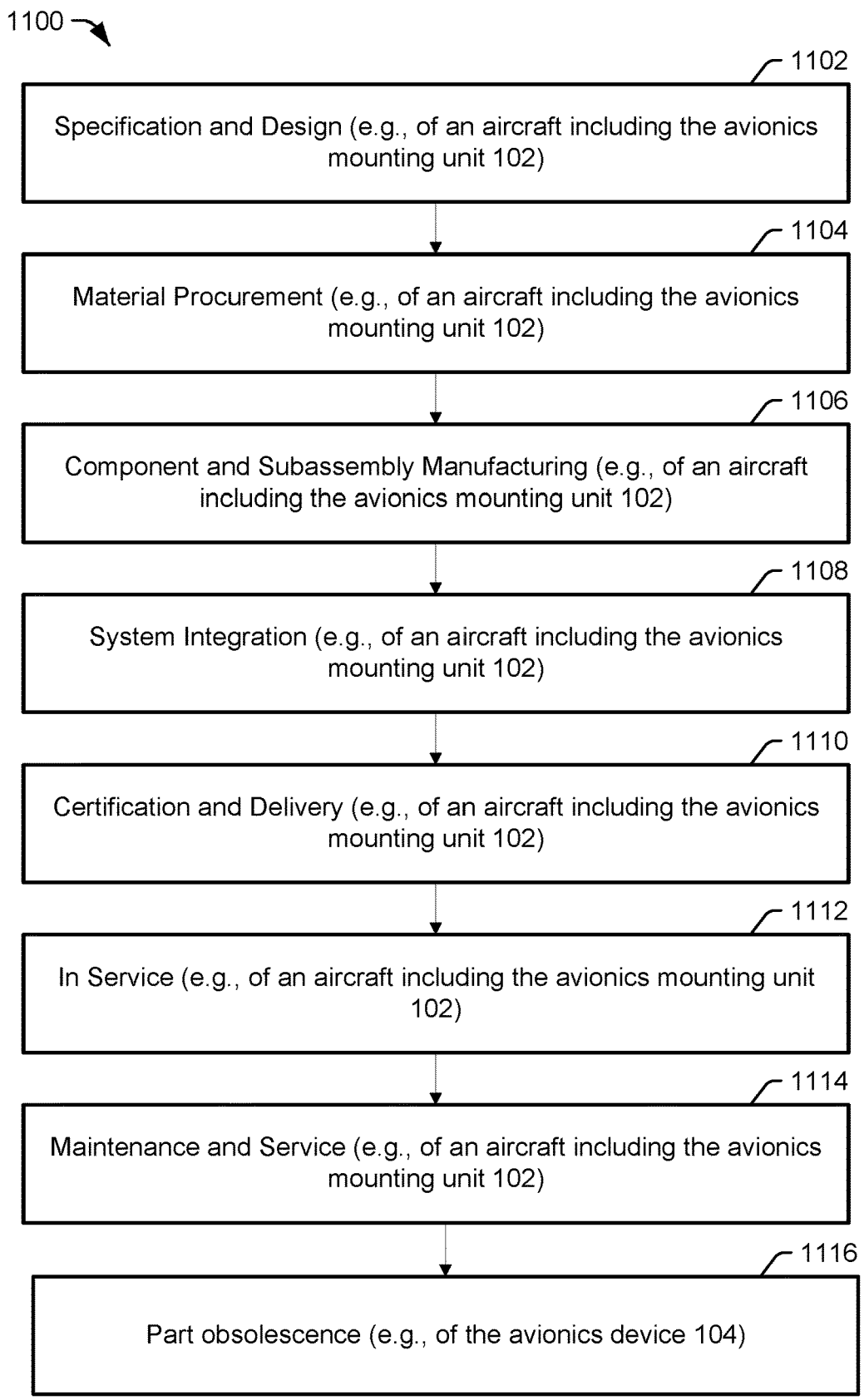
FIG. 11 is a flow chart of an example of a method of manufacturing, reconfiguring, and/or operating an aircraft including a reconfigurable avionics system.
Figure 12:
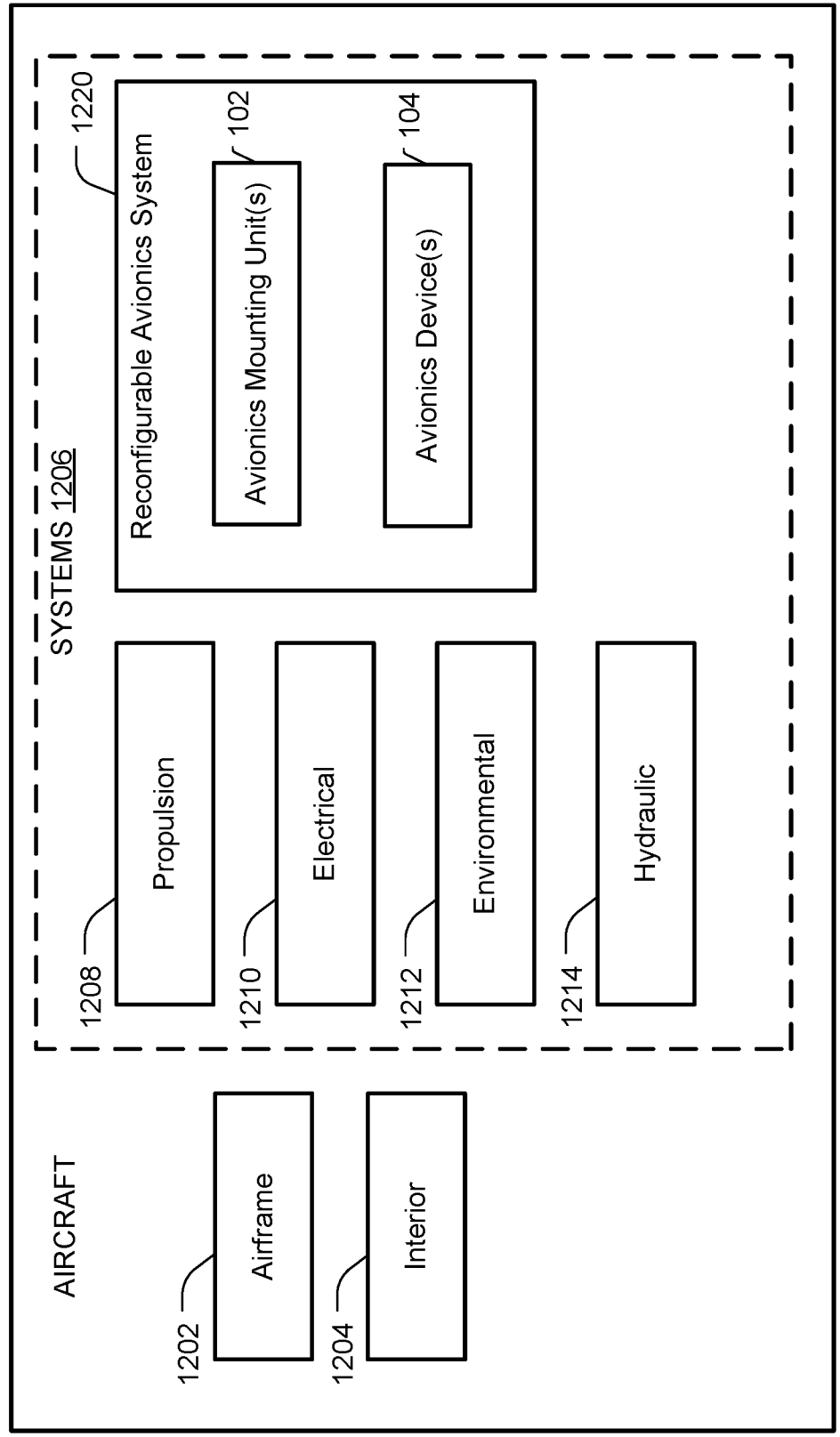
FIG. 12 is a block diagram that illustrates an example of an aircraft including a reconfigurable avionics system.

Referring to FIGS. 11 and 12, examples of the disclosure are described in the context of a aircraft manufacturing and service method 1100 as illustrated by the flow chart of FIG. 11 and the aircraft 100 as illustrated by the block diagram of FIG. 12. The aircraft 100 can be manned or unmanned (e.g., a drone or an unmanned aerial vehicle (UAV).

Referring to FIG. 11, during pre-production, the exemplary method 1100 includes, at 1102, specification and design of the aircraft 100. During the specification and design of the aircraft 100, the method 1100 includes specifying a reconfigurable avionics system that includes one or more avionics mounting units 102. The method 1100 also includes procuring materials to manufacture the aircraft 100, including procurement of the avionics mounting units 102 or procurement of materials to manufacture the avionics mounting units 102.

During production, the method 1100 includes, at 1106, component and subassembly manufacturing and, at 1108, system integration. The avionics mounting units 102 simplify system integration by enabling multiple different types and configurations of avionics devices 104 to operate and interoperate via infrastructure of the aircraft 100 without customizing the avionics devices 104 individually.

At 1110, the method 1100 includes certification and delivery of the aircraft 100 and, at 1112, placing the aircraft 100 in service. Certification and delivery can include certifying the reconfigurable avionics system, or components thereof, such as the avionics mounting units 102. While in service by a customer, the aircraft 100 may be scheduled for routine maintenance and service (which may also include modification, reconfiguration, refurbishment, and so on). At 1114, the method 1100 includes performing maintenance and service on the aircraft 100. In a particular implementation, the reconfigurable avionics system simplifies maintenance and service of the aircraft 100 by enabling simple and fast interchange of the avionics devices 104 within the aircraft 100. At 1116, the method 1100 includes obsolescence of a part of the aircraft 100, such as obsolescence of the avionics device 104. For example, the avionics device 104 may become obsolete based on an obsolescence roadmap. In a particular implementation, the reconfigurable avionics system simplifies replacement of the obsolete avionics device 104 without requiring extensive reconfiguration or upgrade of other components of the aircraft 100 by enabling simple and fast interchange of the avionics devices 104 within the aircraft 100.

Each of the processes of the method 1100 may be performed or carried out by a system integrator, a third party, and/or an operator (e.g., a customer). For the purposes of this description, a system integrator may include without limitation any number of aircraft manufacturers and major-system subcontractors; a third party may include without limitation any number of venders, subcontractors, and suppliers; and an operator may be an airline, leasing company, military entity, service organization, and so on.

Referring to FIG. 12, a block diagram of an illustrative example of the aircraft 100 is shown. The aircraft 100 may have been produced by at least a portion of the method 1100 of FIG. 11. As shown in FIG. 12, the aircraft 100 includes an airframe 1202, an interior 1204, and a plurality of systems 1206. The systems 1206 include for example, a propulsion system 1208, an electrical system 1210, an environmental system 1212, and a hydraulic system 1214. The systems 1206 also include a reconfigurable avionics system 1220 that includes one or more of the avionics mounting units 102 and one or more of the avionics devices 104.

Apparatus and methods included herein may be employed during any one or more of the stages of the method 1100 of FIG. 11. For example, components or subassemblies installed during manufacture of the aircraft 100 (e.g., during component and subassembly manufacturing at 1106, during system integration at 1108, or both) can be fabricated or manufactured in a manner similar to components or subassemblies produced while the aircraft 100 is in service, at 1112. Also, one or more apparatus implementations, method implementations, or a combination thereof may be utilized during the manufacture of the aircraft 100 (e.g., during component and subassembly manufacturing at 1106, during system integration at 1108, or both), for example, by substantially expediting assembly of or reducing the cost of the aircraft 100. Similarly, one or more of apparatus implementations, method implementations, or a combination thereof, may be utilized while the aircraft 100 is in service, at 1112 for example and without limitation, to maintenance and service, at 1114.

The illustrations of the examples described herein are intended to provide a general understanding of the structure of the various implementations. The illustrations are not intended to serve as a complete description of all of the elements and features of apparatus and systems that utilize the structures or methods described herein. Many other implementations may be apparent to those of skill in the art upon reviewing the disclosure. Other implementations may be utilized and derived from the disclosure, such that structural and logical substitutions and changes may be made without departing from the scope of the disclosure. For example, method operations may be performed in a different order than shown in the figures or one or more method operations may be omitted. Accordingly, the disclosure and the figures are to be regarded as illustrative rather than restrictive.

Moreover, although specific examples have been illustrated and described herein, it should be appreciated that any subsequent arrangement designed to achieve the same or similar results may be substituted for the specific implementations shown. This disclosure is intended to cover any and all subsequent adaptations or variations of various implementations. Combinations of the above implementations, and other implementations not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single implementation for the purpose of streamlining the disclosure. Examples described above illustrate but do not limit the disclosure. It should also be understood that numerous modifications and variations are possible in accordance with the principles of the present disclosure. As the following claims reflect, the claimed subject matter may be directed to less than all of the features of any of the disclosed examples. Accordingly, the scope of the disclosure is defined by the following claims and their equivalents.

The invention claimed is:

1. An avionics mounting unit comprising:
   a housing including a first mounting interface and a second mounting interface, the first mounting interface configured to facilitate coupling the housing to a structure of an aircraft and the second mounting interface configured to facilitate coupling an avionics device to the housing, the second mounting interface including slots extending to sides of the housing such that the avionics device can be installed via the slots from any of four sides of the housing, the slots including first slots oriented orthogonal to second slots;

communication circuitry within the housing;

power supply circuitry within the housing;

one or more avionics device interface ports positioned on the housing and coupled to the communication circuitry and to the power supply circuitry, the one or more avionics device interface ports collectively configured to provide power to the avionics device from the power supply circuitry and configured to enable data communications between the avionics device and the communication circuitry; and one or more aircraft interface ports coupled to the communication circuitry and to the power supply circuitry, the one or more aircraft interface ports collectively configured to receive power from a power source of the aircraft and configured to enable data communications between other aircraft systems and the avionics device via the communication circuitry.

2. The avionics mounting unit of claim 1, wherein each of the slots is dimensioned to receive a wedge lock fastener to physically couple the avionics device to the housing.

3. The avionics mounting unit of claim 1, further comprising processing circuitry within the housing, the processing circuitry configured to:

receive, from the avionics device via the one or more avionics device interface ports, first data in a first format;

process the first data to generate second data in a second format, the second format based on an aircraft network communication protocol; and send the second data in the second format to another aircraft system via the one or more aircraft interface ports.

4. The avionics mounting unit of claim 1, further comprising processing circuitry within the housing, the processing circuitry configured to:

receive, from another aircraft system via the one or more aircraft interface ports, third data in a third format;

process the third data to generate fourth data in a fourth format; and send the fourth data in the fourth format to the avionics device via the one or more avionics device interface ports.

5. The avionics mounting unit of claim 1, further comprising a heat sink positioned between two or more of the slots.

6. The avionics mounting unit of claim 1, wherein the first mounting interface is on a first side of the housing and the second mounting interface is on a second side of the housing, wherein the first side is opposite to the second side.

7. The avionics mounting unit of claim 6, wherein the one or more avionics device interface ports are positioned on a third side of the housing and are coupled to the communication circuitry and to the power supply circuitry, the third side adjacent to the first side and adjacent to the second side.

8. An aircraft comprising:
an aircraft structure;
a power source;
an avionics mounting unit including:
a housing having a first mounting interface mounted to the aircraft structure and having a second mounting interface, the second mounting interface including slots extending to sides of the housing such that an avionics device can be installed via the slots from any of four sides of the housing, the slots including first slots oriented orthogonal second slots;

communication circuitry within the housing;

power supply circuitry within the housing;

one or more avionics device interface ports positioned on the housing and coupled to the communication circuitry and to the power supply circuitry; and one or more aircraft interface ports, coupled to the communication circuitry to enable data communications between the communication circuitry and other aircraft devices, and coupling the power source to the power supply circuitry; and an avionics device mounted to the housing via the slots of the second mounting interface and coupled to communication circuitry and to the power supply circuitry via the one or more avionics device interface ports, the avionics device configured to communicate with at least a second avionics device on the aircraft via the one or more aircraft interface ports and the one or more avionics device interface ports.

9. The aircraft of claim 8, further comprising a second aircraft structure and a third avionics device, the third avionics device mounted to the second aircraft structure and coupled to the avionics mounting unit via the one or more avionics device interface ports.

10. The aircraft of claim 8, further comprising a third avionics device, the third avionics device mounted to the housing via the slots and coupled to the communication circuitry and to the power supply circuitry via the one or more avionics device interface ports.

11. The aircraft of claim 8, wherein the one or more aircraft interface ports are coupled to the power source and an aircraft communications network connection via a first wire harness.

12. The aircraft of claim 11, wherein the avionics device is coupled to the communication circuitry via one of the one or more avionics device interface ports by a second wire harness that is external to the housing and is external to the avionics device.

13. The aircraft of claim 11, wherein the avionics device is coupled to the power supply circuitry via one of the one or more avionics device interface ports by a second wire harness that is external to the housing and is external to the avionics device.

14. The aircraft of claim 8, wherein the avionics mounting unit is configured to receive, via the one or more avionics device interface ports, a first voltage from the power source and to provide a second voltage to the avionics device.

15. The aircraft of claim 8, wherein the avionics mounting unit is configured to receive first data from the avionics device, to convert the first data into second data, and to send the second data to the second avionics device.

16. The aircraft of claim 15, wherein the first data is received according to a first communication protocol, the second data is sent according to a second communication protocol, and the first communication protocol is distinct from the second communication protocol.

17. The aircraft of claim 8, wherein each of the slots is dimensioned to receive a wedge lock fastener to physically couple the avionics device to the housing.

18. A method comprising:
retaining an avionics mounting unit relative to a structure of an aircraft via a first mounting interface of a housing of the avionics mounting unit;

retaining an avionics device relative to the housing via a coupling between slots of a second mounting interface of the housing and the avionics device, the second mounting interface including slots extending to sides of the housing such that the avionics device can be installed via the slots from any of four sides of the housing, the slots including first slots oriented orthogonal to second slots;

receiving, at one or more aircraft interface ports of the avionics mounting unit, a first voltage from a power source of the aircraft;

outputting, from one or more avionics device interface ports of the avionics mounting unit, a second voltage to the avionics device, the second voltage derived from the first voltage, and the one or more avionics device interface ports positioned on the housing; and enabling data communications between another aircraft system and the avionics device via the one or more avionics device interface ports of the avionics mounting unit and the one or more aircraft interface ports of the housing.

19. The method of claim 18, wherein enabling data communications between the other aircraft system and the avionics device includes:

receiving, from the avionics device via the one or more avionics device interface ports, first data in a first format;

processing, by processing circuitry of the avionics mounting unit, the first data to generate second data in a second format, the second format based on an aircraft network communication protocol; and sending the second data in the second format to the other aircraft system via the one or more aircraft interface ports.

20. The method of claim 18, wherein enabling data communications between the other aircraft system and the avionics device includes:

receive, from the other aircraft system via the one or more aircraft interface ports, third data in a third format;

processing, by processing circuitry of the avionics mounting unit, the third data to generate fourth data in a fourth format; and sending the fourth data in the fourth format to the avionics device via the one or more avionics device interface ports.

\* \* \* \* \*